(12) United States Patent
Akiyama et al.

(10) Patent No.: US 11,777,466 B2
(45) Date of Patent: Oct. 3, 2023

(54) MATCHING CIRCUIT, MATCHING CIRCUIT ELEMENT, AND COMMUNICATION DEVICE

(71) Applicant: Murata Manufacturing Co., Ltd., Nagaokakyo (JP)

(72) Inventors: Hisashi Akiyama, Nagaokakyo (JP); Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 323 days.

(21) Appl. No.: 17/342,671

(22) Filed: Jun. 9, 2021

(65) Prior Publication Data

US 2021/0297052 A1   Sep. 23, 2021

Related U.S. Application Data

(63) Continuation of application No. PCT/JP2019/047063, filed on Dec. 2, 2019.

(30) Foreign Application Priority Data

Dec. 14, 2018   (JP) .................................. 2018-234507

(51) Int. Cl.
*H03H 7/38* (2006.01)
*H01F 27/28* (2006.01)
(Continued)

(52) U.S. Cl.
CPC .............. *H03H 7/38* (2013.01); *H01F 27/28* (2013.01); *H03F 3/19* (2013.01); *H04B 1/40* (2013.01); *H03F 2200/451* (2013.01)

(58) Field of Classification Search
CPC .... H03H 7/38; H04B 1/40; H03F 3/19; H03F 2203/45731; H03F 2200/451
(Continued)

(56) References Cited

U.S. PATENT DOCUMENTS 5,748,051 A * 5/1998 Lewis .................. H03B 5/1203
331/177 V
7,418,251 B2 * 8/2008 Liu ...................... H03H 7/1766
455/114.1
(Continued)

FOREIGN PATENT DOCUMENTS

JP   2017-084898 A   5/2017
JP   2018-509798 A   4/2018
(Continued)

OTHER PUBLICATIONS

Official Communication issued in International Patent Application No. PCT/JP2019/047063, dated Jan. 21, 2020.

*Primary Examiner* — Emmanuel Bayard
(74) *Attorney, Agent, or Firm* — KEATING & BENNETT, LLP

(57) ABSTRACT

A matching circuit includes first and second input/output ports; first, second, and third coils; and a capacitor. The first coil is connected in series between the first and second input/output ports, and the second coil is connected in shunt between a ground and an input/output line between the first and second input/output ports. The first and second coils are magnetically coupled to each other, the third coil is magnetically coupled to at least one of the first and second coils, the capacitor is directly or indirectly connected to the third coil, and a closed circuit including the capacitor and the third coil is provided.

17 Claims, 12 Drawing Sheets

(51) Int. Cl.
*H03F 3/19* (2006.01)
*H04B 1/40* (2015.01)

(58) Field of Classification Search
USPC ............... 375/258–259, 297, 304, 319, 328
See application file for complete search history.

(56) References Cited

U.S. PATENT DOCUMENTS

| | | | | |
|---|---|---|---|---|
| 7,760,045 | B2* | 7/2010 | Kawasaki | H01P 1/20 |
| | | | | 333/175 |
| 9,698,752 | B2* | 7/2017 | Burgener | H01Q 1/50 |
| 2002/0118067 | A1* | 8/2002 | Hirayama | H03F 3/191 |
| | | | | 330/302 |
| 2005/0146398 | A1* | 7/2005 | Tsai | H01P 1/2135 |
| | | | | 333/134 |
| 2005/0264355 | A1* | 12/2005 | Ziegler | H01J 37/32174 |
| | | | | 330/251 |
| 2007/0285187 | A1* | 12/2007 | Kawasaki | H03H 7/0115 |
| | | | | 333/1 |
| 2009/0045884 | A1* | 2/2009 | Kishimoto | H01P 1/36 |
| | | | | 333/24.2 |
| 2009/0167454 | A1* | 7/2009 | Kishimoto | H01P 1/36 |
| | | | | 333/24.1 |
| 2011/0309994 | A1 | 12/2011 | Kato et al. | |
| 2012/0013419 | A1* | 1/2012 | Shin | H03H 9/706 |
| | | | | 333/133 |
| 2012/0112850 | A1* | 5/2012 | Kim | H03H 9/54 |
| | | | | 333/32 |
| 2016/0211823 | A1 | 7/2016 | Klemens | |
| 2017/0084998 | A1 | 3/2017 | Ishizuka | |
| 2017/0118841 | A1 | 4/2017 | Ino | |
| 2019/0207567 | A1* | 7/2019 | Kong | H03H 7/38 |
| 2022/0255524 | A1* | 8/2022 | Ta | H03H 7/1766 |

FOREIGN PATENT DOCUMENTS

| | | | |
|---|---|---|---|
| WO | 2011/090080 A1 | 7/2011 | |
| WO | 2015/178204 A1 | 11/2015 | |
| WO | WO-2018043206 A1 * | 3/2018 | ........... H03H 7/0115 |

\* cited by examiner

MATCHING CIRCUIT, MATCHING CIRCUIT ELEMENT, AND COMMUNICATION DEVICE

CROSS REFERENCE TO RELATED APPLICATIONS

This application claims the benefit of priority to Japanese Patent Application No. 2018-234507 filed on Dec. 14, 2018 and is a Continuation Application of PCT Application No. PCT/JP2019/047063 filed on Dec. 2, 2019. The entire contents of each application are hereby incorporated herein by reference.

BACKGROUND OF THE INVENTION

1. Field of the Invention

The present invention relates to a matching circuit in a radio frequency circuit, a matching circuit element as a main portion thereof, and a communication device including the matching circuit.

2. Description of the Related Art

A matching circuit for matching an output impedance of an RFIC with a characteristic impedance of an antenna has been provided between the RFIC and the antenna in a mobile phone terminal or the like. Alternatively, a matching circuit for matching an output impedance of a power amplifier with a characteristic impedance of an antenna is provided between the power amplifier and the antenna.

For example, in Japanese Unexamined Patent Application Publication No. 2017-84898, a matching circuit is configured with an LC filter circuit including an inductor connected in series and a capacitor connected in shunt. Further, the LC filter circuit may be configured as a multistage structure as needed.

The matching circuit including the LC filter circuit has a narrow frequency band in which preferable impedance matching is achieved. Further, the large number of elements required for the impedance matching may lead to large loss.

Whereas, an impedance matching circuit having an autotransformer structure is disclosed in International Publication No. 2011/090080.

In the matching circuit of the autotransformer structure disclosed in International Publication No. 2011/090080, the transformer ratio may be changed to follow the impedance frequency characteristics of an antenna by determining the value of the parasitic reactance component of the autotransformer. This enables the impedance matching to be achieved over a wide band.

In a device including a communication circuit, a power amplifier, and an antenna, a case is assumed that such a matching circuit is applied between the communication circuit and the power amplifier, for example. In the case above, it is conceivable to provide a low pass filter or a band pass filter in a front stage or a rear stage of the matching circuit in order to suppress a harmonic component generated in the power amplifier so that the harmonic component is not radiated from the antenna connected to the power amplifier, for example.

In a case that such a matching circuit is provided between a power amplifier and an antenna, a low pass filter or a band pass filter may be provided in a front stage or a rear stage of the matching circuit in order to suppress a harmonic component generated in the power amplifier so that the harmonic component is not radiated from the antenna, for example.

Since the filter is generally configured as an LC circuit, providing the filter inevitably causes loss due to the inductor and the capacitor to increase. As described above, in a radio frequency circuit requiring an impedance matching circuit and a filter, an increase in loss because of the insertion of the filter in a signal propagation line is not an issue limited to the circuit provided between an output portion of the power amplifier and the antenna, but an issue common to the radio frequency circuit including the impedance matching circuit and the filter.

SUMMARY OF THE INVENTION

Preferred embodiments of the present invention provide low insertion loss matching circuits each having an impedance matching function over a wide band and a filter function, matching circuit elements each defining a main portion thereof, and communication devices each including such a matching circuit.

A matching circuit according to a preferred embodiment of the present invention includes a first input/output port, a second input/output port, a first coil, a second coil, a third coil, and a capacitor, the first coil is connected in series between the first input/output port and the second input/output port, the second coil is connected in shunt between a ground and an input/output line between the first input/output port and the second input/output port, the first coil and the second coil are magnetically coupled to each other, the third coil is magnetically coupled to at least one of the first coil and the second coil, and the capacitor is connected to the third coil, and a closed circuit including the capacitor and the third coil and being different from the input/output line is provided.

A matching circuit element according to a preferred embodiment of the present invention includes a multilayer body including a plurality of insulation base materials including an insulation base material in or on which a coil conductor pattern is provided, a first input/output terminal, a second input/output terminal, a ground terminal, and a capacitor connection terminal are provided on an outer surface of the multilayer body, a first coil, a second coil, and a third coil are defined by the coil conductor pattern in the multilayer body, the first coil is connected in series between the first input/output terminal and the second input/output terminal, the second coil is connected in shunt between the ground terminal and an input/output line between the first input/output terminal and the second input/output terminal, the first coil, the second coil, and the third coil share a common winding axis, the first coil is sandwiched between the second coil and the third coil in a direction of the common winding axis, the first coil and the second coil are magnetically coupled to each other, the third coil is magnetically coupled to at least one of the first coil and the second coil, one end of the first coil is connected to the first input/output terminal, and another end of the first coil is connected to the second input/output terminal, one end of the second coil is connected to the second input/output terminal, and another end of the second coil is connected to the ground terminal, and one end of the third coil is connected to the ground terminal, and another end of the third coil is connected to the capacitor connection terminal.

A communication device according to a preferred embodiment of the present invention includes a communication circuit, an antenna, and a matching circuit connected between the communication circuit and the antenna. Alternatively, a communication device according to a preferred embodiment of the present invention includes an amplification circuit, an antenna, and a matching circuit connected between the amplification circuit and the antenna.

The matching circuit includes a first input/output port, a second input/output port, a first coil, a second coil, a third coil, and a capacitor, the first coil is connected in series between the first input/output port and the second input/output port, the second coil is connected in shunt between a ground and an input/output line between the first input/output port and the second input/output port, the first coil and the second coil are magnetically coupled to each other, the third coil is magnetically coupled to at least one of the first coil and the second coil, and the capacitor is connected to the third coil, and a closed circuit including the capacitor and the third coil is provided.

According to preferred embodiments of the present invention, it is possible to obtain low insertion loss matching circuits each having an impedance matching function over a wide band and having a predetermined attenuation pole, matching circuit elements each defining a main portion thereof, and communication devices each including a matching circuit.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
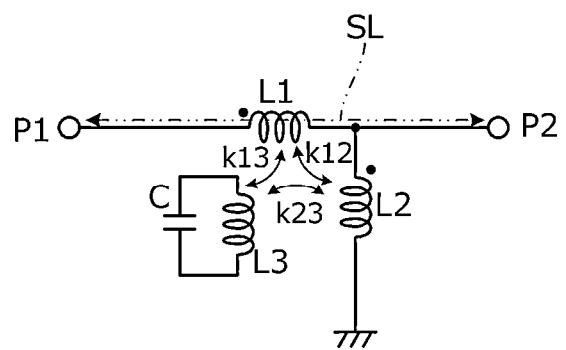
FIG. 1 is a circuit diagram of a matching circuit according to a first preferred embodiment of the present invention.

First, a matching circuit, a matching circuit element, and a communication device according to preferred embodiments of the present invention will be described.

A matching circuit according to a preferred embodiment of the present invention includes a first input/output terminal, a second input/output terminal, a first coil, a second coil, a third coil, and a capacitor, the first coil is connected in series between the first input/output terminal and the second input/output terminal, the second coil is connected in shunt between a ground and an input/output line configured between the first input/output terminal and the second input/output terminal, the first coil and the second coil are magnetically coupled to each other, the third coil is magnetically coupled to at least one of the first coil and the second coil, and the capacitor is connected to the third coil, and a closed circuit including the capacitor and the third coil and being different from the input/output line is provided.

With the above configuration, an autotransformer includes the first coil and the second coil, and the closed circuit including the capacitor and the third coil operates as a resonance circuit that resonates at a predetermined frequency determined by the capacitance of the capacitor and the inductance of the third coil, and the resonance circuit is magnetically coupled to the autotransformer. Accordingly, it is possible to achieve a frequency characteristic of the insertion loss having an attenuation pole at the resonant frequency while the frequency dependence of the impedance matching by the autotransformer is not largely changed, that is, the matching characteristic is maintained. Further, since the third coil is magnetically coupled to the autotransformer, it is possible to reduce or prevent an increase in loss due to an element as compared with a circuit configuration in which an LC filter is simply inserted in a front stage or a rear stage of the autotransformer.

In a matching circuit according to a preferred embodiment of the present invention, the third coil is more strongly magnetically coupled to the first coil than to the second coil. With this structure, the attenuation at the attenuation pole is large.

In a matching circuit according to a preferred embodiment of the present invention, the third coil is magnetically coupled to the first coil and to the second coil. With this structure, the frequency width of the attenuation band is increased, and the attenuation is large.

In a matching circuit according to a preferred embodiment of the present invention, the capacitor is a variable capacitance element in which capacitance changes in accordance with a control voltage. With this structure, the frequency of the attenuation pole may be determined by the control voltage.

In a matching circuit according to a preferred embodiment of the present invention, the closed circuit includes a resistance component inserted in series. With this structure, a Q factor of the resonance of the resonance circuit including the closed circuit may be decreased to a predetermined value, and this makes it possible to determine the frequency band width of the attenuation pole.

A matching circuit element according to a preferred embodiment of the present invention includes a multilayer body including a plurality of insulation base materials including an insulation base material in or on which a coil conductor pattern is provided, a first input/output terminal, a second input/output terminal, a ground terminal, and a capacitor connection terminal are provided on an outer surface of the multilayer body, a first coil, a second coil, and a third coil include the coil conductor pattern in the multilayer body, the first coil is connected in series between the first input/output terminal and the second input/output terminal, the second coil is connected in shunt between the ground terminal and an input/output line configured between the first input/output terminal and the second input/output terminal, the first coil, the second coil, and the third coil share a common winding axis, the first coil is sandwiched between the second coil and the third coil in a direction of the common winding axis, the first coil and the second coil are magnetically coupled to each other, the third coil is magnetically coupled to at least one of the first coil and the second coil, one end of the first coil is connected to the first input/output terminal, and another end of the first coil is connected to the second input/output terminal, one end of the second coil is connected to the second input/output terminal, and another end of the second coil is connected to the ground terminal, and one end of the third coil is connected to the ground terminal, and another end of the third coil is connected to the capacitor connection terminal.

With the above configuration, since the first coil and the second coil are coupled to each other with a high degree of coupling, the frequency dependence because of the inductance component (leakage inductance) not contributing to the coupling is reduced. Further, since the third coil is coupled to each of the first coil and the second coil with a high degree of coupling, the resonance circuit, which includes the capacitor and the third coil, is magnetically coupled to the autotransformer when the capacitor is connected between the capacitor connection terminal and the ground. This makes it possible to achieve the frequency characteristic of the insertion loss having the attenuation pole at the resonant frequency of the resonance circuit.

In a matching circuit element according to a preferred embodiment of the present invention, a coil diameter of the second coil is smaller than that of the first coil. With this structure, the coupling of the second coil and the third coil is reduced or prevented, and a decrease in attenuation at the attenuation pole is reduced or prevented.

A communication device according to a preferred embodiment of the present invention includes a communication circuit, an antenna, and a matching circuit connected between the communication circuit and the antenna, the matching circuit includes a first input/output terminal, a second input/output terminal, a first coil, a second coil, a third coil, and a capacitor, the first coil is connected in series between the first input/output terminal and the second input/output terminal, the second coil is connected in shunt between a ground and a connection between the first coil and the second input/output terminal, the first coil and the second coil are magnetically coupled to each other, the third coil is magnetically coupled to at least one of the first coil and the second coil, and the capacitor is connected to the third coil, and a closed circuit including the capacitor and the third coil is provided.

With the above configuration, an impedance matching of a communication circuit and an antenna having a lower impedance than an output impedance of the communication circuit may be achieved, and the characteristic to attenuate the predetermined frequency band may be achieved.

A communication device according to a preferred embodiment of the present invention includes an amplification circuit, an antenna, and a matching circuit connected between the amplification circuit and the antenna, the matching circuit includes a first input/output terminal, a second input/output terminal, a first coil, a second coil, a third coil, and a capacitor, the first coil is connected in series between the first input/output terminal and the second input/output terminal, the second coil is connected in shunt between a ground and a connection between the first coil and the second input/output terminal, the first coil and the second coil are magnetically coupled to each other, the third coil is magnetically coupled to at least one of the first coil and the second coil, and the capacitor is connected to the third coil, and a closed circuit including the capacitor and the third coil is provided.

With the above configuration, an impedance matching of a communication circuit and an amplification circuit having a lower impedance than the output impedance of the communication circuit may be achieved, and the characteristic to attenuate the predetermined frequency band may be achieved.

Hereinafter, preferred embodiments of the present invention will be described with reference to examples and the drawings. In the drawings, the same reference signs are denoted to the same or corresponding portions. The preferred embodiments are separately described for the sake of convenience in consideration of ease of description or ease of understanding of important points, but partial substitutions or combinations of configurations described in different preferred embodiments are possible. In the second and subsequent preferred embodiments, descriptions of matters common to those in the first preferred embodiment will be omitted, and only different points will be described. In particular, the same or similar advantageous operational effects achieved by the same or similar configurations will not be described in every preferred embodiment.

First Preferred Embodiment

FIG. 1 is a circuit diagram of a matching circuit according to a first preferred embodiment of the present invention. A matching circuit 101A illustrated in FIG. 1 includes a first input/output port P1, a second input/output port P2, a first coil L1, a second coil L2, a third coil L3, and a capacitor C. The first coil L1 is connected in series between the first input/output port P1 and the second input/output port P2, and the second coil L2 is connected in shunt between the ground and an input/output line SL configured between the first input/output port P1 and the second input/output port P2. The first coil L1 and the second coil L2 are magnetically coupled to each other. The third coil L3 is magnetically coupled to at least one of the first coil L1 and the second coil L2. The capacitor C is connected to the third coil L3, and a closed circuit including the capacitor C and the third coil L3 is provided.

In FIG. 1, the respective coupling coefficients are represented as: k12 for the first coil L1 and the second coil L2; k13 for the first coil L1 and the third coil L3; and k23 for the second coil L2 and the third coil L3.

The autotransformer includes the first input/output port P1, the second input/output port P2, the first coil L1, and the second coil L2.

Figure 2A:
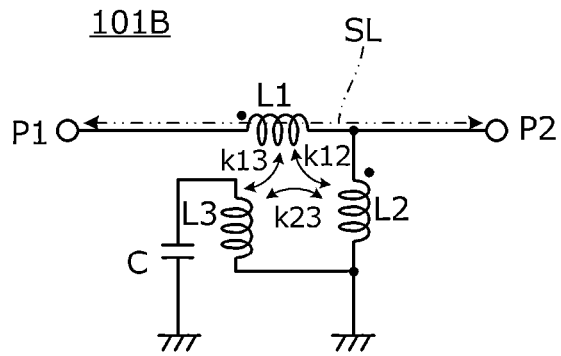
FIGS. 2A to 2C are circuit diagrams of another matching circuit 101B according to the first preferred embodiment of the present invention.
Figure 2B:
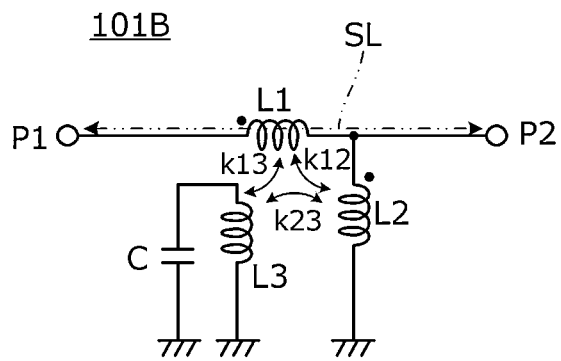
Figure 2C:
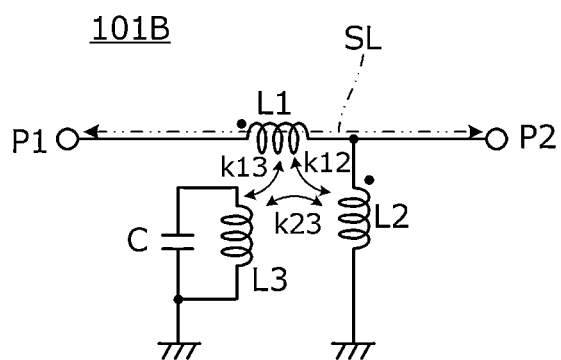

FIGS. 2A to 2C are circuit diagrams of another matching circuit 101B according to the first preferred embodiment. These circuit diagrams of the matching circuit 101B are equivalently the same. The matching circuit 101B is different from the matching circuit 101A illustrated in FIG. 1 in that the closed circuit including the capacitor C and the third coil L3 is grounded. In the matching circuit 101B, at least one of the parasitic capacitance generated between the third coil L3 and the first coil L1 and the parasitic capacitance generated between the third coil and the second coil L2 has an influence on the characteristics. When these parasitic capacitances are small, the matching circuit 101B is equivalently the same as the matching circuit 101A.

Figure 3A:
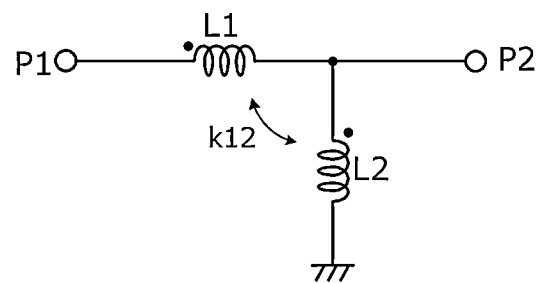
FIG. 3A is a circuit diagram illustrating a configuration of an autotransformer including a first coil L1 and a second coil L2 illustrated in FIG. 1.
Figure 3B:
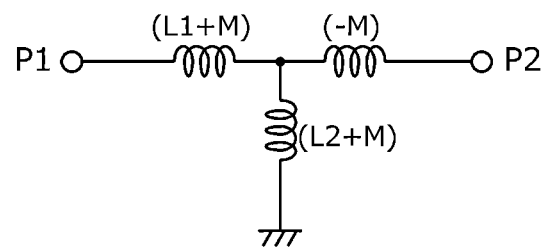
FIG. 3B is an equivalent circuit diagram of the circuit illustrated in FIG. 3A.

FIG. 3A is a circuit diagram illustrating a configuration of the autotransformer including the first coil L1 and the second coil L2 illustrated in FIG. 1. FIG. 3B is an equivalent circuit diagram of the circuit illustrated in FIG. 3A. Here, elements are denoted as follows: L1 for a self-inductance of the first coil L1; L2 for a self-inductance of the second coil L2; k12 for the coupling coefficient of the first coil L1 and the second coil L2; and M for a mutual inductance generated by the coupling of the first coil L1 and the second coil L2. With the above denotation, the following equation is satisfied.

$$M = k12\sqrt{(L1*L2)}$$

The transformer ratio is expressed as (L1+L2+2M):L2. Accordingly, in the case that (L1+L2+2M):L2=50:3, for example, when the impedance of the circuit connected to the first input/output port P1 of the matching circuit 101A is about 50Ω and the impedance of the circuit connected to the second input/output port P2 of the matching circuit 101A is about 3Ω, the matching circuit 101A appropriately achieves impedance matching between the input and the output. Further, such a transformer ratio enables the following. In the case that the impedance of the circuit connected to the first input/output port P1 is higher than the impedance of the circuit connected to the second input/output port P2, the impedance matching is appropriately achieved by only adjusting the coupling coefficient k12 of the first coil L1 and the second coil L2 without changing the self-inductance L1 of the first coil L1 and the self-inductance L2 of the second coil L2.

Figure 4:
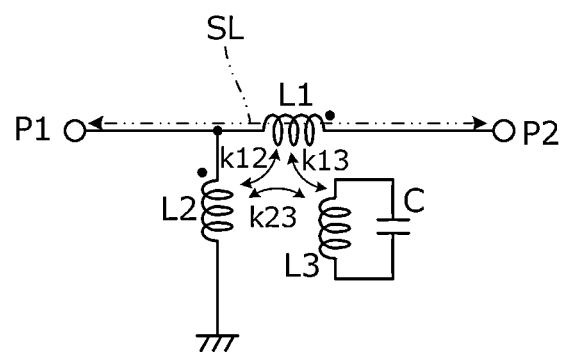
FIG. 4 is a circuit diagram of another matching circuit 101C of the first preferred embodiment of the present invention.

FIG. 4 is a circuit diagram of another matching circuit 101C according to the first preferred embodiment. The matching circuit 101A and the matching circuit 101C are different from each other in the connection position of the second coil L2 with respect to the input/output line SL. Alternatively, it may be expressed that the matching circuit 101A and the matching circuit 101C are in a relationship in which the first input/output port P1 and the second input/output port P2 are exchanged.

In the matching circuits 101A and 101B illustrated in FIG. 1 and FIGS. 2A to 2C, the closed circuit including the capacitor C and the third coil L3 operates as a resonance circuit that resonates at a predetermined frequency determined by the capacitance of the capacitor C and the inductance of the third coil L3. The third coil L3 is magnetically coupled to at least one of the first coil L1 and the second coil L2, so that the resonance circuit is magnetically coupled to the autotransformer. The advantageous operational effects achieved with the coupling of the resonance circuit will be described with reference to FIGS. 5A to 5C, FIG. 6, and FIG. 7.

Figure 5A:
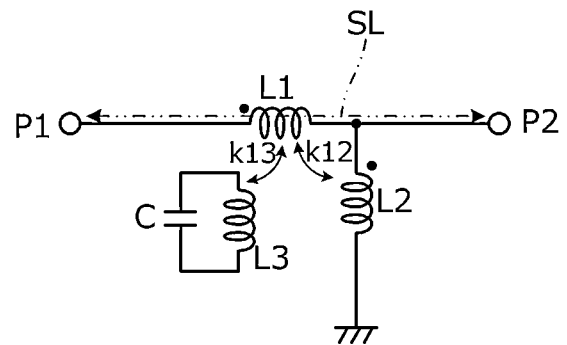
FIGS. 5A to 5C are circuit diagrams of matching circuits 101Aa, 101Ab, and 101Ac, respectively.
Figure 5B:
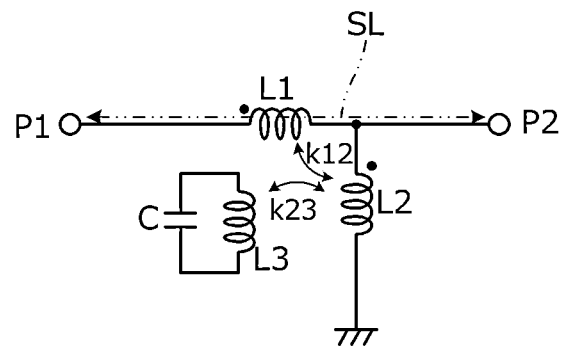
Figure 5C:
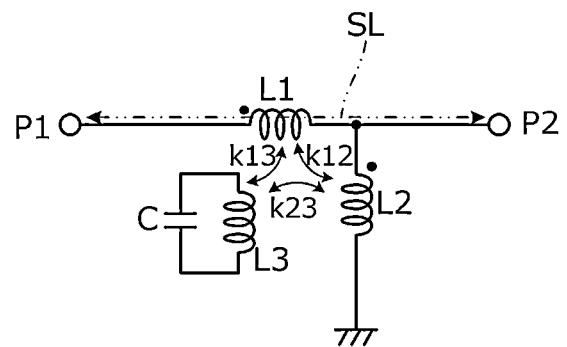

FIGS. 5A to 5C are circuit diagrams of matching circuits 101Aa, 101Ab, and 101Ac, respectively. The matching circuits 101Aa, 101Ab, and 101Ac are different from each other in the relationship between the coupling of the first coil L1, the second coil L2, and the third coil L3. In all of the matching circuits, the first coil L1 and the second coil L2 are coupled. In the example illustrated in FIG. 5A, the third coil L3 is coupled to the first coil L1. In other words, the third coil L3 is more strongly coupled to the first coil L1 than to the second coil L2. In the example illustrated in FIG. 5B, the third coil L3 is coupled to the second coil L2. In other words, the third coil L3 is more strongly coupled to the second coil L2 than to the first coil L1. In the example illustrated in FIG. 5C, the third coil L3 is coupled to the first coil L1 and the second coil L2.

Figure 6:
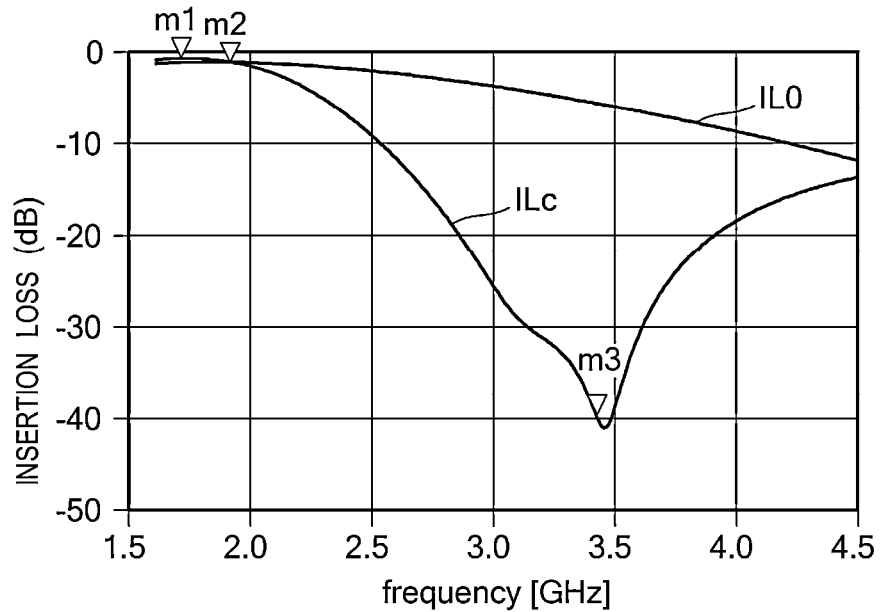
FIG. 6 is a diagram illustrating an operational effect of a resonance circuit including a closed circuit including a capacitor C and a third coil L3, and is a frequency characteristic diagram of insertion loss between a first input/output port P1 and a second input/output port P2.

FIG. 6 is a diagram illustrating the advantageous operational effects of the resonance circuit defined by the closed circuit including the capacitor C and the third coil L3 and is the frequency characteristic diagram of insertion loss between the first input/output port P1 and the second input/output port P2. IL0 is the characteristic of a matching circuit (comparative example) without the closed circuit including the capacitor C and the third coil L3, and ILc is the characteristic of the matching circuit 101Ac illustrated in FIG. 5C.

The filter characteristic of the matching circuit 101Ac is intended to let the fundamental wave of, for example, about 1.71 GHz to about 1.91 GHz to pass through and to attenuate the second harmonic wave of, for example, about 3.42 GHz. Markers m1 and m2 in FIG. 6 represent the frequency of about 1.71 GHz to about 1.91 GHz being the pass frequency band, and a marker m3 represents the center frequency of about 3.42 GHz in the attenuation band.

Here, elements are denoted as follows: L1 for the self-inductance of the first coil L1; L2 for the self-inductance of the second coil L2; L3 for the self-inductance of the third coil L3; C for the capacitance of the capacitor C; k12 for the coupling coefficient of the first coil L1 and the second coil L2; k13 for the coupling coefficient of the first coil L1 and the third coil L3; and k23 for the coupling coefficient of the second coil L2 and the third coil L3. Values of the elements are as follows.

Matching Circuit 101Ac
 L1=about 2.4 nH
 L2=about 0.5 nH
 L3=about 0.6 nH
 C=about 14.3 pF
 k12=about 0.5
 k13=about 0.6
 k23=about 0.6

With the values of the elements as described above, the insertion loss at each frequency is as follows.

|  | 1.71 GHZ | 1.91 GHz | 3.42 GHz |
|---|---|---|---|
| Matching Circuit 101Ac | −0.8 dB | −1.1 dB | −39.7 dB |
| Comparative Example | −1.3 dB | −1.3 dB | −6.0 dB |

As described above, the attenuation in the attenuation band may be larger than about −30 dB because of the coupling of the resonance circuit defined by the closed circuit including the capacitor C and the third coil L3.

Figure 7:
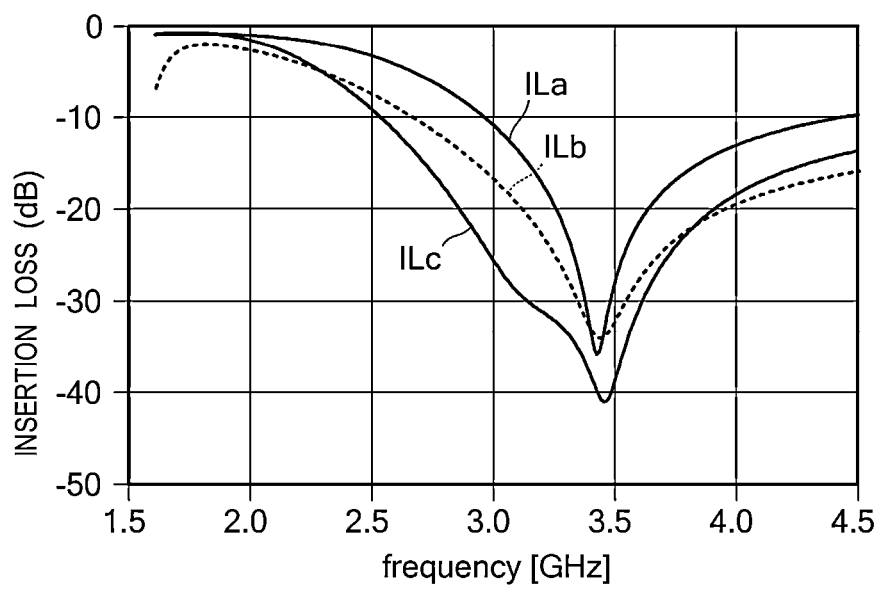
FIG. 7 is a diagram illustrating an operational effect of the resonance circuit including the closed circuit including the capacitor C and the third coil L3, and is a frequency characteristic diagram of insertion loss between the first input/output port P1 and the second input/output port P2.

FIG. 7 is a diagram illustrating the advantageous operational effects of the resonance circuit defined by the closed circuit including the capacitor C and the third coil L3, and is the frequency characteristic diagram of the insertion loss between the first input/output port P1 and the second input/output port P2. ILa is the characteristic of the matching circuit 101Aa illustrated in FIG. 5A, ILb is the characteristic of the matching circuit 101Ab illustrated in FIG. 5B, and ILc is the characteristic of the matching circuit 101Ac illustrated in FIG. 5C. The values of the elements of the matching circuits 101Aa and 101Ab are as follows. The values of the elements of the matching circuit 101Ac are as have already been described.

Matching Circuit 101Aa
    L1=about 3.0 nH
    L2=about 0.5 nH
    L3=about 0.2 nH
    C=about 6.4 pF
    k12=about 0.7
    k13=about 0.7
    k23=0
Matching Circuit 101Ab
    L1=about 3.9 nH
    L2=about 1.6 nH
    L3=about 0.6 nH
    C=about 20.5 pF
    k12=about 0.4
    k13=0
    k23=about 0.5

The insertion loss of each matching circuit at each frequency is as follows.

|  | 1.71 GHz | 1.91 GHz | 3.42 GHz |
|---|---|---|---|
| Matching Circuit 101Aa | −0.8 dB | −0.9 dB | −35.7 dB |
| Matching Circuit 101Ab | −2.2 dB | −2.0 dB | −33.7 dB |
| Matching Circuit 101Ac | −0.8 dB | −1.1 dB | −39.7 dB |

As described above, the third coil L3 is more strongly magnetically coupled to the first coil L1 than to the second coil L2 in the matching circuit 101Aa, and the attenuation at the attenuation pole is larger in the matching circuit 101Aa than in the matching circuit 101Ab. Further, the third coil L3 is magnetically coupled to the first coil L1 and the second coil L2 in the matching circuit 101Ac, and the attenuation band is wider in frequency range and the attenuation is larger in the matching circuit 101Ac than in the matching circuits 101Aa and 101Ab.

Figure 8A:
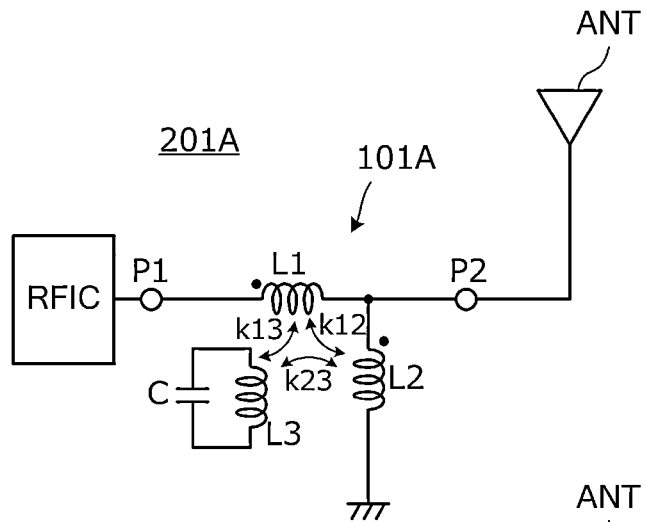
FIGS. 8A to 8C are circuit diagrams illustrating a configuration of a main portion of a communication device including a matching circuit 101A.
Figure 8B:
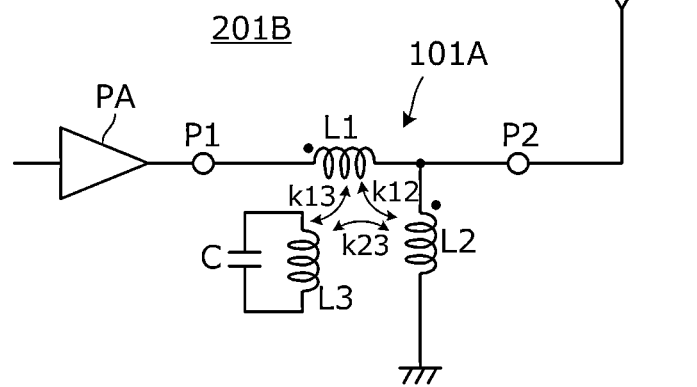
Figure 8C:
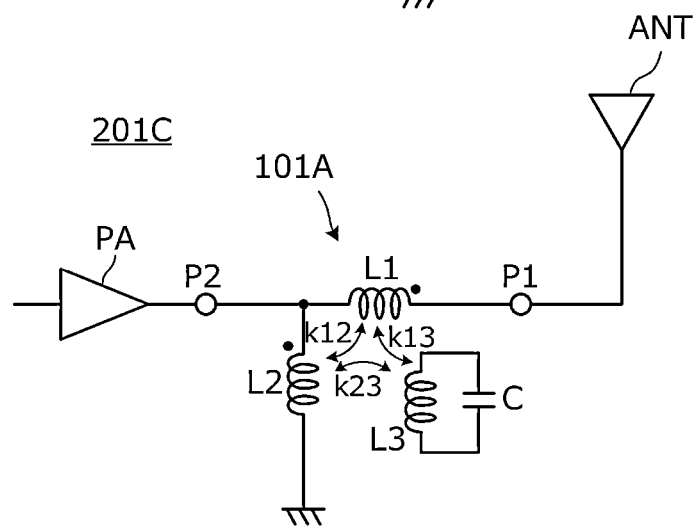

FIGS. 8A to 8C are circuit diagrams illustrating the configuration of the main portion of the communication device including the matching circuit 101A.

In a communication device 201A illustrated in FIG. 8A, an RFIC (integrated radio frequency signal circuit) is connected to the first input/output port P1 of the matching circuit 101A, and an antenna ANT is connected to the second input/output port P2 of the matching circuit 101A. The input/output impedance of the RFIC is about 50Ω, and the characteristic impedance of the antenna ANT is about 3Ω, for example. In the matching circuit 101A, the values of the self-inductances and the mutual inductance of the first coil L1 and the second coil L2 are determined to convert the impedance at 50:3. Further, a transmission signal output from the RFIC in a pass frequency band or a reception signal input to the RFIC in a pass frequency band is allowed to pass through, and distortion components, which are harmonic waves, such as a second harmonic wave, for example, are blocked. Note that, the characteristic impedance of the antenna is not limited to about 3 and may take any value in the range of about 1Ω to about 50Ω, for example. In this case, the impedance conversion ratio of the matching circuit is adjusted in accordance with the value.

In a communication device 201B illustrated in FIG. 8B, a power amplifier PA for power amplification of a transmission signal is connected to the first input/output port P1 of the matching circuit 101A, and the antenna ANT is connected to the second input/output port P2 of the matching circuit 101A. The output impedance of the power amplifier PA is about 10Ω, for example, and the characteristic impedance of the antenna ANT is about 3Ω, for example. In the matching circuit 101A, the values of the self-inductances and the mutual inductance of the first coil L1 and the second coil L2 are determined to convert the impedance at 10:3. Further, a transmission signal output from the power amplifier PA in a pass frequency band is allowed to pass through, and distortion components mainly generated in the power amplifier PA, which are harmonic waves such as a second harmonic wave, for example, are blocked.

In a communication device 201C illustrated in FIG. 8C, the antenna ANT is connected to the first input/output port P1 of the matching circuit 101A, and the power amplifier PA for power amplification of the transmission signal is connected to the second input/output port P2 of the matching circuit 101A. The output impedance of the power amplifier PA is about 3Ω, for example, and the characteristic impedance of the antenna ANT is about 10Ω, for example. In the matching circuit 101A, values of the self-inductances and mutual inductance of the first coil L1 and the second coil L2 are determined so that the impedance conversion ratio of the first input/output port P1:the second input/output port P2 is 10:3. Further, a transmission signal output from the power amplifier PA in a pass frequency band is allowed to pass through, and distortion components mainly generated in the power amplifier PA, which are harmonic waves such as a second harmonic wave, for example, are blocked. As described above, in the case that the output impedance of the power amplifier PA is higher than the characteristic impedance of the antenna ANT, the connection relationship between the first coil L1 and the second coil L2 changes.

The output impedance of the power amplifier may take any value in the range of about 1Ω to about 10Ω, for example. Further, the characteristic impedance of the antenna may take any value in the range of about 1Ω to about 50Ω, for example. In this case, the impedance conversion ratio of the matching circuit is adjusted in accordance with the values.

Second Preferred Embodiment

Figure 9:
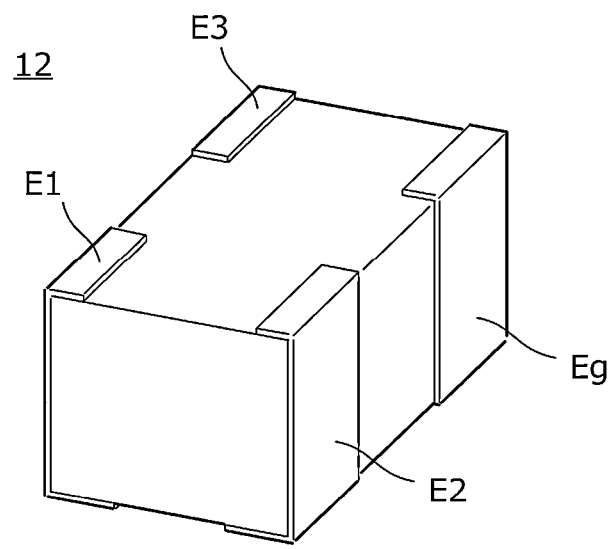
FIG. 9 is a perspective view of a matching circuit element 12 according to a second preferred embodiment of the present invention.
Figure 10:
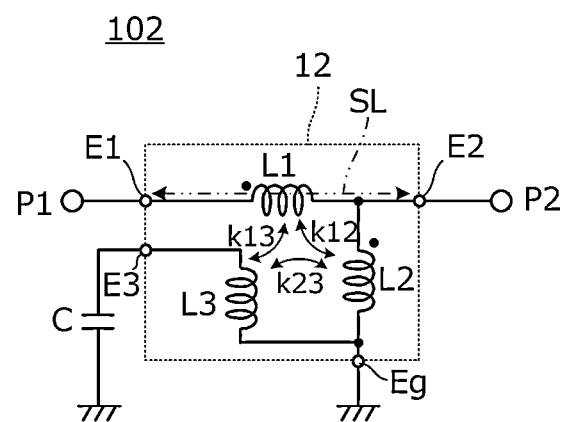
FIG. 10 is a circuit diagram of a matching circuit 102 including the matching circuit element 12.

An example of a matching circuit element will be described in a second preferred embodiment of the present invention. FIG. 9 is a perspective view of a matching circuit element 12 according to the second preferred embodiment. FIG. 10 is a circuit diagram of a matching circuit 102 including the matching circuit element 12.

As illustrated in FIG. 9, the matching circuit element 12 includes a multilayer body including a plurality of insulation base materials including an insulation base material, on which a coil conductor pattern described later is provided, and is configured as a surface mount chip component. On an outer surface of the multilayer body, a first input/output terminal E1, a second input/output terminal E2, a ground terminal Eg, and an external connection terminal E3 are provided. The first coil L1, the second coil L2, and the third coil L3 are included in the matching circuit element 12 as illustrated in FIG. 10. The first coil L1 is connected in series between the first input/output terminal E1 and the second input/output terminal E2. The second coil L2 is connected in shunt between the ground terminal Eg and the input/output line SL between the first input/output terminal E1 and the second input/output terminal E2. The first coil L1 and the second coil L2 are magnetically coupled to each other, and the third coil L3 is magnetically coupled to at least one of the first coil L1 and the second coil L2.

One end of the first coil L1 is connected to the first input/output terminal E1, and another end of the first coil L1 is connected to the second input/output terminal E2. One end of the second coil L2 is connected to the second input/output terminal E2, and another end of the second coil L2 is connected to the ground terminal Eg.

One end of the third coil L3 is connected to the ground terminal Eg, and another end of the third coil L3 is connected to the external connection terminal E3.

The first input/output terminal E1 is connected to the first input/output port P1, the second input/output terminal E2 is connected to the second input/output port P2, and the ground terminal Eg is connected to the ground as illustrated in FIG. 10. Further, the capacitor C is connected between the external connection terminal E3 and the ground.

Figure 11:
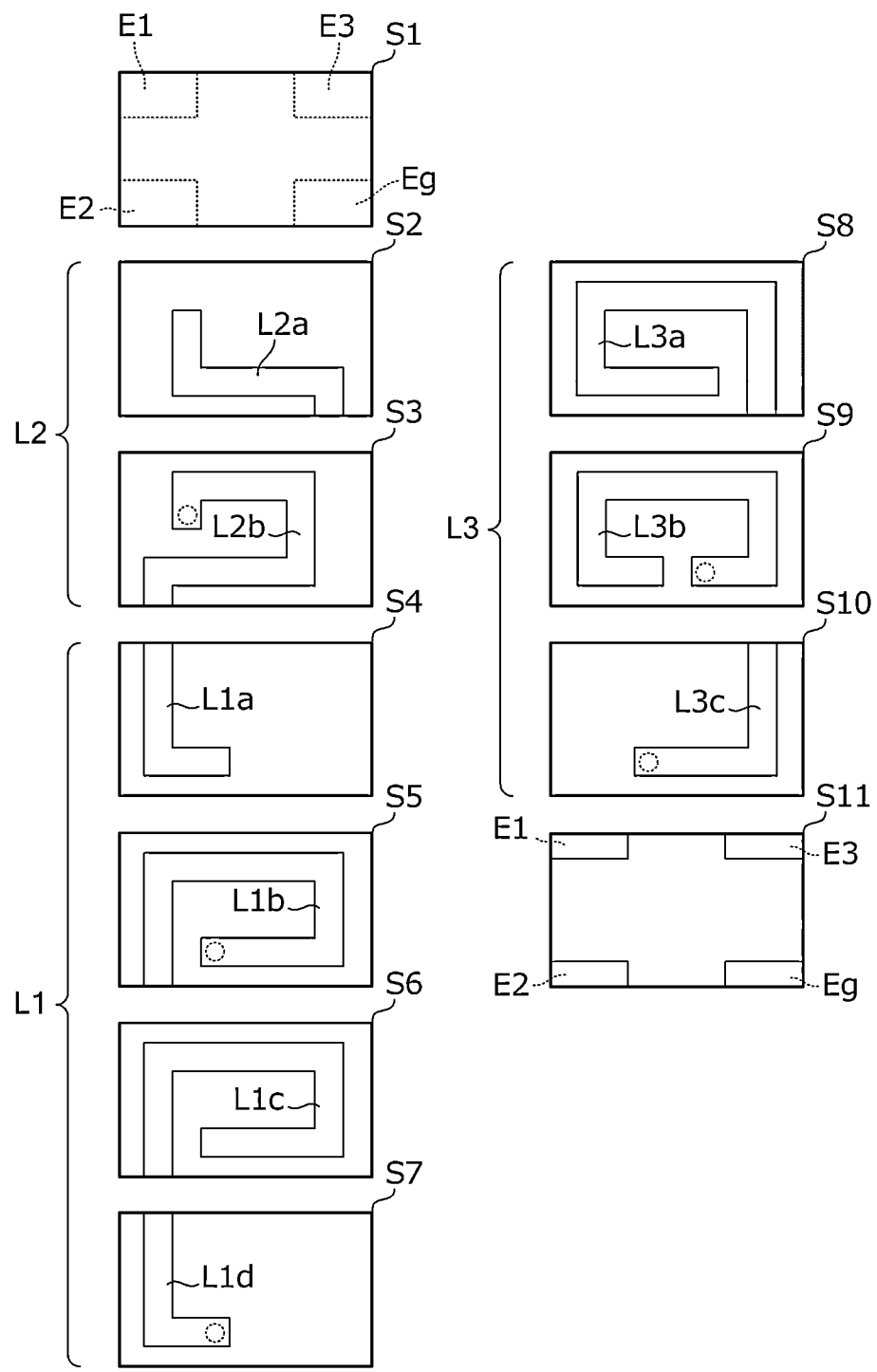
FIG. 11 is a plan view of layers of the matching circuit element 12.

FIG. 11 is a plan view of layers of the matching circuit element 12. The matching circuit element 12 includes a plurality of insulation base materials including insulation base materials S1 to S11. In FIG. 11, the insulation base material S1 is a lowermost insulation base material, and the insulation base material S11 is an uppermost insulation base material. These insulation base materials are a non-magnetic ceramic base material or a non-magnetic resin base material. Various conductor patterns are provided on the insulation base materials S2 to S10. Further, via conductors illustrated with a circle of a dashed line are provided in the insulation base materials S3, S5, S7, S9, and S10. The "coil conductor pattern" includes not only the conductor pattern provided on the surface of the insulation base material but also an interlayer connection conductor. The "interlayer connection conductor" includes not only the via conductor but also an end surface electrode provided on an end surface of the multilayer body as illustrated in FIG. 9 and FIG. 11.

In FIG. 11, the second coil L2 includes conductor patterns L2a and L2b provided on the insulation base materials S2 and S3 and the via conductor. The first coil L1 includes conductor patterns L1a to L1d provided on the insulation base materials S4 to S7 and the via conductors. Further, the third coil L3 includes conductor patterns L3a to L3c provided on the insulation base materials S8 to S10 and the via conductors.

As described above, the first coil L1, the second coil L2, and the third coil L3 have the common winding axis. The first coil L1 is sandwiched between the second coil L2 and the third coil L3 in the direction of the common winding axis.

With the above configuration, since the first coil L1 and the second coil L2 are coupled to each other with a high degree of coupling, the frequency dependence because of the inductance component (leakage inductance) not contributing to the coupling is reduced or prevented. Further, since the first coil L1 is positionally close to each of the second coil L2 and the third coil L3, the first coil L1 is coupled to each of the second coil L2 and the third coil L3 with a high coupling coefficient. Since the second coil L2 and the third coil L3 are positionally separated from each other, the coupling coefficient of the second coil L2 and the third coil L3 is reduced. Further, the coil diameter of the second coil L2 is smaller than the coil diameter of the first coil L1. With this, the coupling of the second coil L2 and the third coil L3, which are positionally separated from each other, is further reduced. That is, the coupling coefficient k23 illustrated in FIG. 10 is smaller than the coupling coefficients k12 and k13.

The matching circuit 101Aa illustrated in FIG. 5A may include the matching circuit element illustrated in FIG. 11. The frequency characteristic of the insertion loss of the matching circuit exhibits large attenuation at the attenuation pole as indicated by ILa in FIG. 7. Further, the frequency characteristic of the insertion loss of the matching circuit exhibits a wide pass band when the states of a signal are defined as follows. The "signal passing state" is the case that the insertion loss is equal to or less than about |3 dB| (insertion loss is equal to or less than about −3 dB), and the "signal blocking state" is the case that the insertion loss is greater than about |3 dB| (insertion loss is greater than about −3 dB). Specifically, the upper limit of the pass band is about 2.465 GHz. Thus, it is effective for the case where there is a band to be passed in the vicinity of a band to be attenuated, for example.

Figure 12:
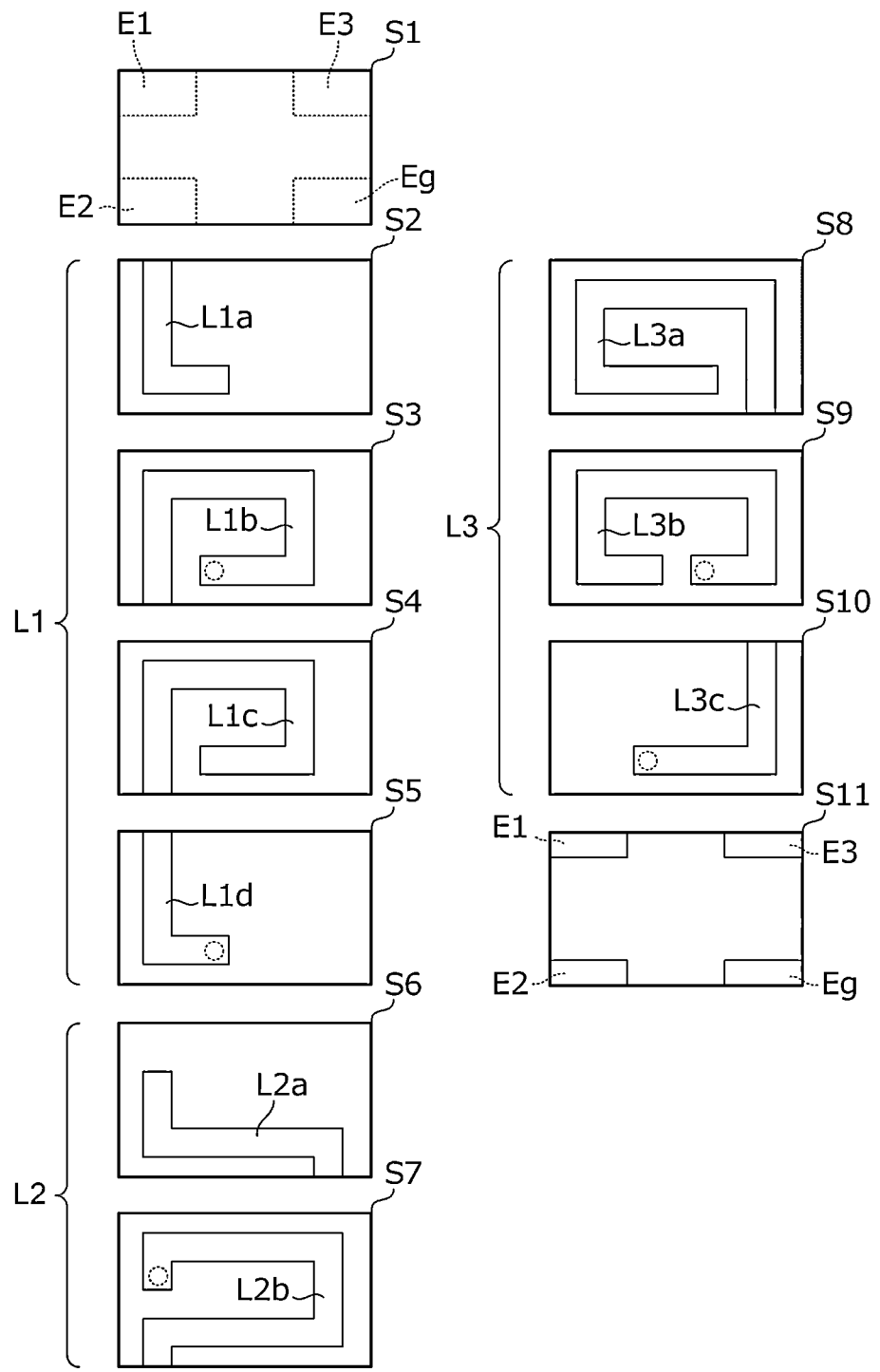
FIG. 12 is a plan view of layers of the matching circuit element 12 having a configuration different from that in FIG. 11.

FIG. 12 is a plan view of layers of the matching circuit element 12 having a configuration different from that in FIG. 11. The matching circuit element 12 includes a plurality of insulation base materials including the insulation base materials S1 to S11. In FIG. 12, the first coil L1 includes the conductor patterns L1a to L1d provided on the insulation base materials S2 to S5 and the via conductors. The second coil L2 includes the conductor patterns L2a and L2b provided on the insulation base materials S6 and S7, and the via conductor. Further, the third coil L3 includes the conductor patterns L3a to L3c provided on the insulation base materials S8 to S10 and the via conductors. That is, in the example illustrated in FIG. 12, the second coil L2 is sandwiched between the first coil L1 and the third coil L3 in the direction of the common winding axis. Since the second coil L2 is positionally close to each of the first coil L1 and the third coil L3, the second coil L2 is coupled to each of the first coil L1 and the third coil L3 with a high coupling coefficient. Since the first coil L1 and the third coil L3 are positionally separated from each other, the coupling of the first coil L1 and the third coil L3 is reduced. Further, the coil diameter of the first coil L1 is smaller than the coil diameter of the second coil L2. With this, the coupling of the first coil L1 and the third coil L3, which are positionally separated from each other, is further reduced. Other configurations are the same or substantially the same as those of the matching circuit element illustrated in FIG. 11.

The matching circuit 101Ab illustrated in FIG. 5B may include the matching circuit element illustrated in FIG. 12. The frequency characteristic of the insertion loss of the matching circuit is indicated by ILb in FIG. 7.

Figure 13:
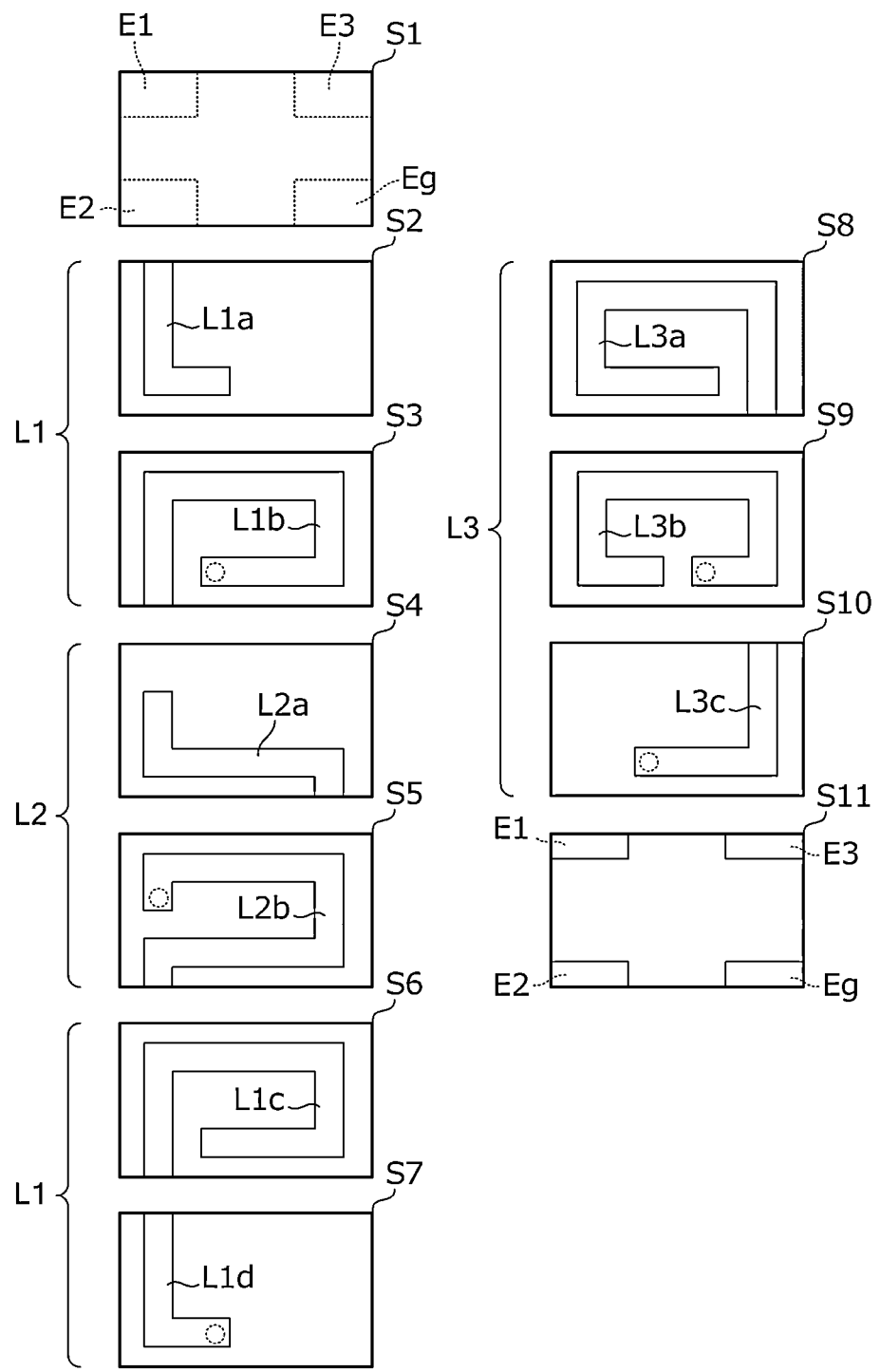
FIG. 13 is a plan view of layers of the matching circuit element 12 having a configuration different from the configurations in FIG. 11 and FIG. 12.

FIG. 13 is a plan view of layers of the matching circuit element 12 having a configuration different from the configurations in FIG. 11 and FIG. 12. The matching circuit element 12 includes a plurality of insulation base materials including the insulation base materials S1 to S11. In FIG. 13, the first coil L1 includes the conductor patterns L1a, L1b, L1c, and L1d provided on the insulation base materials S2, S3, S6, and S7, and the via conductors. The second coil L2 includes the conductor patterns L2a and L2b provided on the insulation base materials S4 and S5, and the via conductor. Further, the third coil L3 includes the conductor patterns L3a to L3c provided on the insulation base materials S8 to S10 and the via conductors. That is, in the example illustrated in FIG. 13, the second coil L2 is sandwiched between the portions of the first coil L1 in the direction of the common winding axis, and the second coil L2 is in a position spaced away from the third coil L3. Other configurations are the same or substantially the same as those of the matching circuit element illustrated in FIG. 11.

With the above configuration, since the first coil L1 and the second coil L2 are positionally close to each other, the first coil L1 and the second coil L2 are coupled with a high coupling coefficient. Similarly, since the first coil L1 and the third coil L3 are positionally close to each other, the first coil L1 and the third coil L3 are coupled with a high coupling coefficient. Further, since the coil diameters of the first coil L1, the second coil L2, and the third coil L3 are equal or substantially equal to one another, all of the coupling coefficients are large. That is, all of the coupling coefficients k12, k13, and k23 illustrated in FIG. 10 are large.

The matching circuit 101Ac illustrated in FIG. 5C may include the matching circuit element illustrated in FIG. 13. The frequency characteristic of the insertion loss of the matching circuit exhibits a wide attenuation frequency band and large attenuation at the attenuation pole as indicated by ILc in FIG. 7.

Third Preferred Embodiment

A matching circuit in which the attenuation pole frequency is variable will be described in a third preferred embodiment of the present invention.

Figure 14:
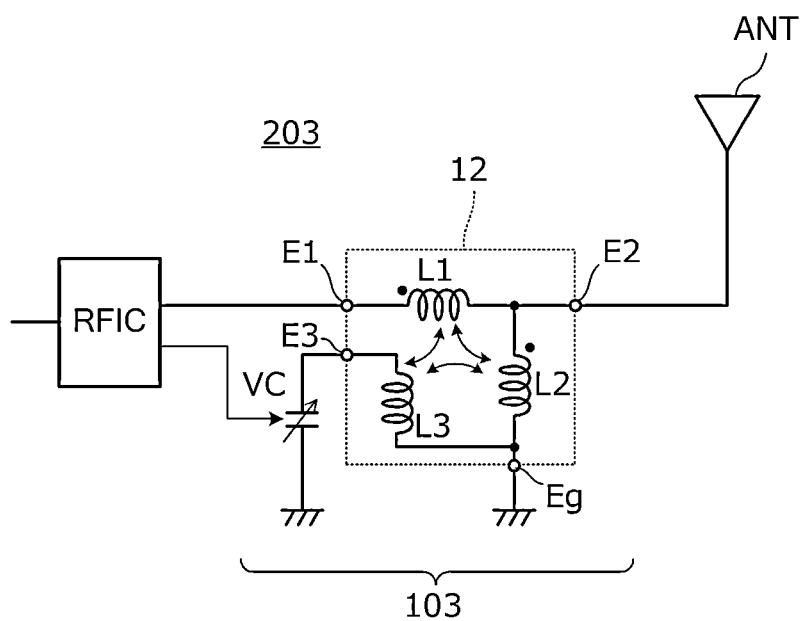
FIG. 14 is a circuit diagram of a communication device 203 according to a third preferred embodiment of the present invention.

FIG. 14 is a circuit diagram of a communication device 203 according to the third preferred embodiment. The communication device 203 illustrated in FIG. 14 includes a matching circuit 103, the RFIC, and the antenna ANT. The matching circuit 103 includes the matching circuit element 12 and a variable capacitance element VC. The variable capacitance element VC has a capacitance in accordance with the control voltage applied from the outside. For example, the variable capacitance element VC may be a variable capacitance diode or a capacitor having a micro electro mechanical system (MEMS) structure. The RFIC applies the control voltage to the variable capacitance element VC. Other configurations are as illustrated in FIG. 10 in the second preferred embodiment.

Figure 15:
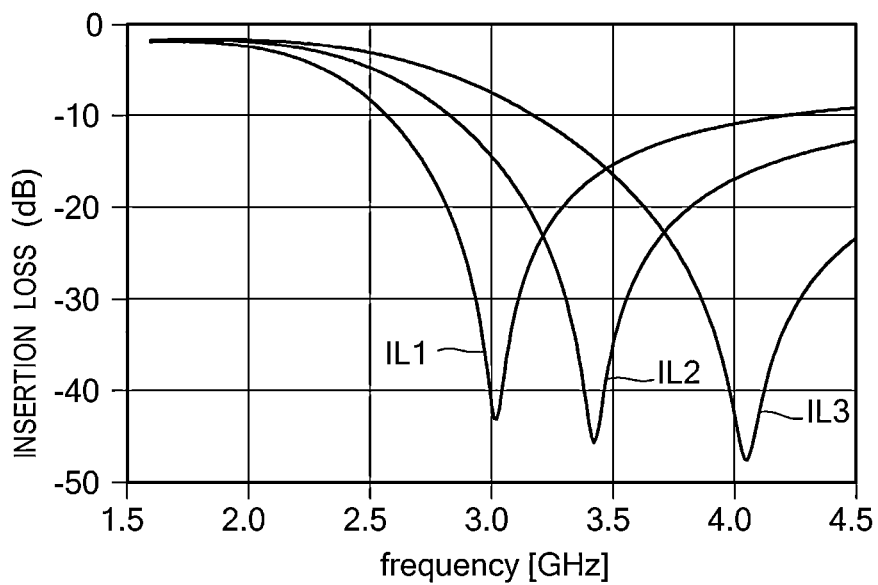
FIG. 15 is a diagram illustrating an operational effect of a resonance circuit including a closed circuit including a variable capacitance element VC and the third coil L3, and is a frequency characteristic diagram of insertion loss between a first input/output terminal E1 and a second input/output terminal E2 in FIG. 14.

FIG. 15 is a diagram illustrating the advantageous operational effects of a resonance circuit defined by a closed circuit including the variable capacitance element VC and the third coil L3, and is the frequency characteristic diagram of the insertion loss between the first input/output terminal E1 and the second input/output terminal E2 in FIG. 14. The insertion loss characteristic in accordance with the capacitance of the variable capacitance element VC is represented as: IL1 for the maximum capacitance; IL3 for the minimum capacitance; and IL2 for the moderate capacitance.

According to the present preferred embodiment, by setting the control voltage for the variable capacitance element VC, the attenuation pole frequency (center frequency of attenuation frequency band) may be determined from about 3.0 GHz to about 4.1 GHz, for example. With this, by determining the control voltage for the variable capacitance element VC in accordance with an unnecessary frequency component to be attenuated, the unnecessary frequency component may effectively be reduced or prevented.

Fourth Preferred Embodiment

In a fourth preferred embodiment of the present invention, there will be described a matching circuit in which the configuration of the closed circuit including the capacitor C and the third coil L3 is different from that described above, and a communication device including the matching circuit.

Figure 16A:
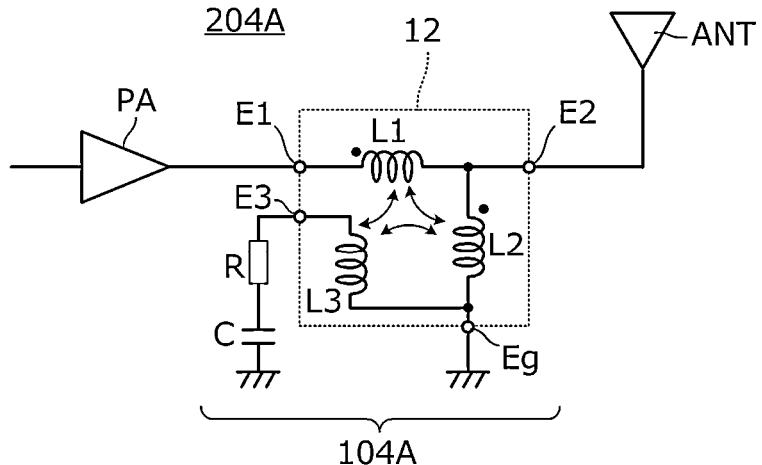
FIG. 16A is a circuit diagram of a communication device 204A according to a fourth preferred embodiment of the present invention.

FIG. 16A is a circuit diagram of a communication device 204A according to the fourth preferred embodiment. The communication device 204A includes the power amplifier PA, a matching circuit 104A, and the antenna ANT. The matching circuit 104A includes the matching circuit element 12, the capacitor C, and a resistance element R. Other configurations are as illustrated in FIG. 10 in the second preferred embodiment.

Figure 16B:
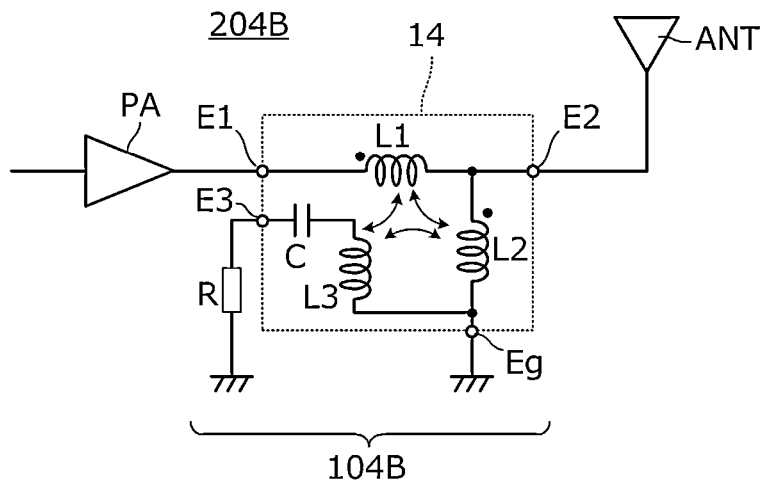
FIG. 16B is a circuit diagram of a communication device 204B according to the fourth preferred embodiment of the present invention.

FIG. 16B is a circuit diagram of a communication device 204B according to the fourth preferred embodiment. The communication device 204B includes the power amplifier PA, a matching circuit 104B, and the antenna ANT. The matching circuit 104B includes a matching circuit element 14 and the resistance element R. The matching circuit element 14 includes the capacitor C therein. Further, the matching circuit element 14 includes the external connection terminal E3. The resistance element R is connected between the external connection terminal E3 and the ground. Other configurations are as illustrated in FIG. 10 in the second preferred embodiment.

Figure 16C:
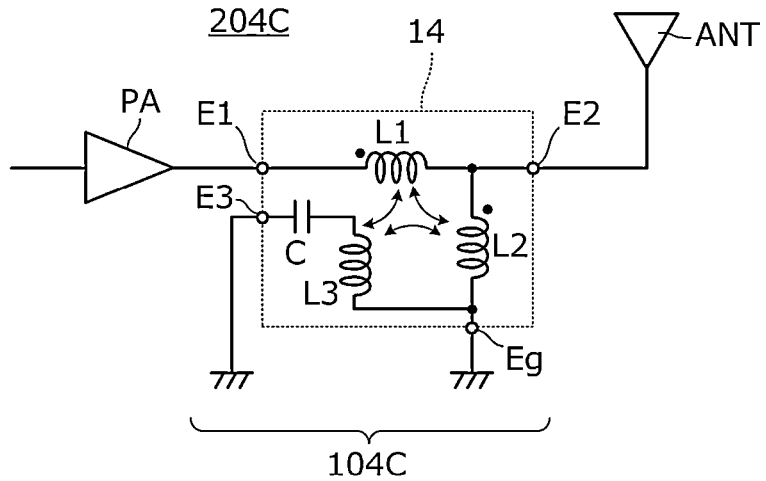
FIG. 16C is a circuit diagram of a communication device 204C according to the fourth preferred embodiment of the present invention.

FIG. 16C is a circuit diagram of a communication device 204C according to the fourth preferred embodiment. The communication device 204C includes the power amplifier PA, a matching circuit 104C, and the antenna ANT. The matching circuit 104C includes the matching circuit element 14. The matching circuit element 14 includes the capacitor C therein. Further, the matching circuit element 14 includes the external connection terminal E3. The external connection terminal E3 is connected to the ground. Other configurations are as illustrated in FIG. 10 in the second preferred embodiment.

The capacitor C illustrated in FIGS. 16B and 16C includes a pair of planar conductor patterns with a predetermined gap therebetween in the multilayer body illustrated in FIG. 9, for example. The capacitor C is connected between the third coil L3 and the external connection terminal E3.

The configuration of the communication device illustrated in FIGS. 16A and 16B includes the resistance component in the closed circuit including the capacitor C and the third coil L3. This makes it possible to reduce the Q factor of the resonance of the resonance circuit defined by the closed circuit to a predetermined value, and thus the frequency band width of the attenuation pole may be determined.

With the configuration of the communication device illustrated in FIG. 16C, the number of elements may be reduced and the circuit may be simplified in the matching circuit 104C, and thus the communication device 204C may be reduced in size.

Finally, the description of the preferred embodiments described above is illustrative and non-restrictive in every respect. Modifications and changes may appropriately be made by those skilled in the art. The scope of the present invention is indicated by the appended claims rather than by the foregoing preferred embodiments. Further, the scope of the present invention includes changes to the preferred embodiments within the range of equivalency of the appended claims.

For example, the one end of the second coil L2 may be connected between the first input/output port P1 or the first input/output terminal E1 and the first coil L1 in accordance with the impedance conversion ratio as illustrated in FIG. 4 in the matching circuit or the matching circuit element illustrated not only in the first preferred embodiment but also in each of the subsequent preferred embodiments.

The capacitor C may be integrally provided to the matching circuit element other than the example illustrated in FIG. 16B.

The resistance element R to determine the Q factor of the resonance of the resonance circuit defined by the closed circuit may be a variable resistance element, for example. Alternatively, a plurality of resistance elements having different resistance values and a switch circuit to select the resistance elements may be provided. That is, the Q factor of the resonance of the resonance circuit defined by the closed circuit may be varied by determining the resistance value by a control signal.

In FIG. 11 to FIG. 13, the examples in which each of the first coil L1, the second coil L2, and the third coil L3 is defined by a coil including one or more turns in the winding number are illustrated. However, the coil may include conductor patterns having less than one turn.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A matching circuit comprising:
a first input/output port, a second input/output port, a first coil, a second coil, a third coil, and a capacitor; wherein
the first coil is connected in series between the first input/output port and the second input/output port;
the second coil is connected in shunt between a ground and an input/output line between the first input/output port and the second input/output port;
the first coil and the second coil are magnetically coupled to each other;
the third coil is magnetically coupled to at least one of the first coil and the second coil; and
the capacitor is connected to the third coil, and a closed circuit including the capacitor and the third coil and being different from the input/output line is provided.

2. The matching circuit according to claim 1, wherein the third coil is more strongly magnetically coupled to the first coil than to the second coil.

3. The matching circuit according to claim 1, wherein the third coil is magnetically coupled to the first coil and to the second coil.

4. The matching circuit according to claim 1, wherein the capacitor is a variable capacitance element of which a capacitance changes in accordance with a control voltage.

5. The matching circuit according to claim 1, wherein the closed circuit includes a resistance component included in series.

6. A matching circuit element comprising:
a multilayer body including a plurality of insulation base materials including an insulation base material in or on which a coil conductor pattern is provided; wherein
a first input/output terminal, a second input/output terminal, a ground terminal, and a capacitor connection terminal are provided on an outer surface of the multilayer body;
a first coil, a second coil, and a third coil are defined by the coil conductor pattern in the multilayer body;
the first coil is connected in series between the first input/output terminal and the second input/output terminal;
the second coil is connected in shunt between the ground terminal and an input/output line between the first input/output terminal and the second input/output terminal;
the first coil, the second coil, and the third coil share a common winding axis;
the first coil is sandwiched between the second coil and the third coil in a direction of the common winding axis;
the first coil and the second coil are magnetically coupled to each other;
the third coil is magnetically coupled to at least one of the first coil and the second coil;
one end of the first coil is connected to the first input/output terminal, and another end of the first coil is connected to the second input/output terminal;
one end of the second coil is connected to the second input/output terminal, and another end of the second coil is connected to the ground terminal; and
one end of the third coil is connected to the ground terminal, and another end of the third coil is connected to the capacitor connection terminal.

7. The matching circuit element according to claim 6, wherein a coil diameter of the second coil is smaller than a coil diameter of the first coil.

8. A communication device comprising:
a communication circuit, an antenna, and a matching circuit connected between the communication circuit and the antenna; wherein
the matching circuit includes:
a first input/output port, a second input/output port, a first coil, a second coil, a third coil, and a capacitor;
the first coil is connected in series between the first input/output port and the second input/output port;
the second coil is connected in shunt between a ground and a connection between the first coil and the second input/output port;
the first coil and the second coil are magnetically coupled to each other;
the third coil is magnetically coupled to at least one of the first coil and the second coil; and
the capacitor is connected to the third coil, and a closed circuit including the capacitor and the third coil is provided.

9. The communication device according to claim 8, wherein the third coil is more strongly magnetically coupled to the first coil than to the second coil.

10. The communication device according to claim 8, wherein the third coil is magnetically coupled to the first coil and to the second coil.

11. The communication device according to claim 8, wherein the capacitor is a variable capacitance element of which a capacitance changes in accordance with a control voltage.

12. The communication device according to claim 8, wherein the closed circuit includes a resistance component included in series.

13. A communication device comprising:
an amplification circuit, an antenna, and a matching circuit connected between the amplification circuit and the antenna; wherein the matching circuit includes:
- a first input/output port, a second input/output port, a first coil, a second coil, a third coil, and a capacitor;
- the first coil is connected in series between the first input/output port and the second input/output port;
- the second coil is connected in shunt between a ground and a connection between the first coil and the second input/output port;
- the first coil and the second coil are magnetically coupled to each other;
- the third coil is magnetically coupled to at least one of the first coil and the second coil; and
- the capacitor is connected to the third coil, and a closed circuit including the capacitor and the third coil is provided.

14. The communication device according to claim 13, wherein the third coil is more strongly magnetically coupled to the first coil than to the second coil.

15. The communication device according to claim 13, wherein the third coil is magnetically coupled to the first coil and to the second coil.

16. The communication device according to claim 13, wherein the capacitor is a variable capacitance element of which a capacitance changes in accordance with a control voltage.

17. The communication device according to claim 13, wherein the closed circuit includes a resistance component included in series.

* * * * *